United States Patent
Voldman

(10) Patent No.: US 8,423,936 B2
(45) Date of Patent: Apr. 16, 2013

(54) SEMICONDUCTOR STRUCTURE AND METHOD OF DESIGNING SEMICONDUCTOR STRUCTURE TO AVOID HIGH VOLTAGE INITIATED LATCH-UP IN LOW VOLTAGE SECTORS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/358,105

(22) Filed: Jan. 25, 2012

(65) Prior Publication Data

US 2012/0124533 A1    May 17, 2012

Related U.S. Application Data

(62) Division of application No. 12/030,903, filed on Feb. 14, 2008, now Pat. No. 8,108,817.

(51) Int. Cl.
G06F 17/50    (2006.01)
(52) U.S. Cl.
USPC ........... 716/112; 716/106; 716/132; 716/136; 703/16
(58) Field of Classification Search ............ 716/51, 716/54, 55, 112, 122, 132, 136; 703/16
See application file for complete search history.

(56) References Cited

U.S. PATENT DOCUMENTS

| 3,920,493 | A | 11/1975 | Kravitz |
| 5,719,427 | A | 2/1998 | Tong et al. |
| 6,376,890 | B1 | 4/2002 | Tihanyi |
| 6,996,786 | B2* | 2/2006 | Voldman ............. 716/115 |
| 7,020,857 | B2 | 3/2006 | Singh et al. |
| 7,089,520 | B2* | 8/2006 | Voldman ............. 716/112 |
| 7,200,825 | B2 | 4/2007 | Watson et al. |
| 7,350,160 | B2 | 3/2008 | Perez et al. |
| 7,401,311 | B2* | 7/2008 | Voldman ............. 716/115 |
| 7,861,190 | B1 | 12/2010 | Kretchmer et al. |
| 7,985,640 | B2 | 7/2011 | Salcedo et al. |
| 8,108,817 | B2* | 1/2012 | Voldman ............. 716/110 |
| 8,108,822 | B2* | 1/2012 | Voldman ............. 716/139 |
| 2004/0268284 | A1 | 12/2004 | Perez et al. |
| 2005/0071789 | A1* | 3/2005 | Voldman ............. 716/4 |
| 2005/0108670 | A1* | 5/2005 | Voldman ............. 716/10 |

(Continued)

FOREIGN PATENT DOCUMENTS

JP    2007109712 A    4/2007

OTHER PUBLICATIONS

Huang et al., "Static CMOS Latch-Up Considerations in VHIC Design", IEEE Journal of Solid-State Circuits, vol. 25, No. 2, Apr. 1990, pp. 613-616.*
Matloubian, "Smart Body Contact for SOI MOSFETs", 1989 IEEE SOS/SOI Technology Conference, Oct. 3-5, 1989, pp. 128-129.*
McDonald et al., "High-Voltage Device Modeling for SPICE Simulation of HVIC's", IEEE Transaction on Computer-Aided Design, vol. 7, No. 3, Mar. 1988, pp. 425-432.*

(Continued)

*Primary Examiner* — Phallaka Kik
(74) *Attorney, Agent, or Firm* — David Cain; Roberts Mlotkowski Safran & Cole, P.C.

(57) ABSTRACT

A method and semiconductor structure to avoid latch-up is disclosed. The method includes identifying at least one high voltage device on a semiconductor chip, identifying a circuit on the semiconductor chip separated from the identified at least one high voltage device by a guard ring, evaluating the circuit for a latch-up condition, and when the latch-up condition occurs, adjusting the contact-circuit spacing in the circuit.

15 Claims, 2 Drawing Sheets

U.S. PATENT DOCUMENTS

| | | |
|---|---|---|
| 2005/0133839 A1 | 6/2005 | Okushima |
| 2006/0048080 A1 | 3/2006 | Watson et al. |
| 2006/0166426 A1 | 7/2006 | Voldman |
| 2008/0098337 A1 | 4/2008 | Perez et al. |
| 2008/0277689 A1 | 11/2008 | Kodama et al. |
| 2009/0070718 A1* | 3/2009 | Voldman ............................ 716/5 |

OTHER PUBLICATIONS

Voldman, "The Influence of a Novel Contacted Polysilicon-Filled Deep Trench (DT) Biased Structure and Its Voltage Bias State on CMOS Latchup", IEEE 44$^{th}$ International Reliability Physics Symposium, 2006, pp. 151-158.*

* cited by examiner

SEMICONDUCTOR STRUCTURE AND METHOD OF DESIGNING SEMICONDUCTOR STRUCTURE TO AVOID HIGH VOLTAGE INITIATED LATCH-UP IN LOW VOLTAGE SECTORS

CROSS REFERENCE TO RELATED APPLICATIONS

The invention is a divisional application of co-pending U.S. application Ser. No. 12/030,903, filed on Feb. 14, 2008, the contents of which are incorporated by reference in their entirety herein.

FIELD OF THE INVENTION

The invention relates generally to a semiconductor structure having mixed voltage levels and to a method of designing the semiconductor structure to integrate the mixed voltage levels.

BACKGROUND OF THE INVENTION

CMOS (complementary metal oxide semiconductor) circuits are widely used in many applications, e.g., portable computers and cellular telephones. CMOS, due to very low power consumption and dissipation as well minimization of the current in the "off" state, is a very effective device configuration for implementing digital functions.

In implementation, CMOS semiconductors comprise both n-channel and p-channel MOS field effect transistors (MOSFETs). Further, within these CMOS structures, parasitic current paths exist associated by so-called parasitic bipolar transistors, which, under normal conditions, are not activated. However, when the parasitic pnp and npn bipolar transistors are activated, CMOS latch-up can occur. Activation can be initiated by voltage or current perturbations, or ionizing radiation. CMOS latch-up can also occur when regenerative feedback occurs between the npn and pnp parasitic bipolar transistors.

Various CMOS designs have been conceived to prevent CMOS latch-up. For example, it is known to increase the spacing between devices which, in turn, increases the effective base width of the parasitic transistors. As should be understood, with such a design, the bipolar current gain will decrease as the base width increases. Thus, in such a design, as the N-diffusion moves away from the N-well, or the P-diffusion moves away from the N-well edge, or vertically, CMOS latch-up is less likely to occur.

Another approach to reducing CMOS latch-up sensitivity has been to increase doping concentrations. For example, by increasing the doping concentrations, the minority carrier lifetime is decreased; when the doping is in the base region, the bipolar current gain decreases. In a further design, isolation structures, such as shallow trench isolation (STI), have been provided to reduce the CMOS latch-up sensitivity.

As technology scales, however, the spacing between the P+ diffusion and the N-well and the N+ diffusion and N-well spacing is becoming smaller. Due to this scaling, the previous techniques to prevent CMOS latch-up are becoming more problematic. For example, it is more difficult to increase the doping in specific areas, since the increase in dopants will increase the out-diffusion of the dopants which, in turn, increases the capacitance of the device (at the junctions) impacting circuit performance. Also, as for shallow trench isolation (STI) structures, P+ to N+ space is scaled to maintain the aspect ratio of the isolation; hence the shallow trench isolation (STI) structure becomes shallower every generation, not deeper.

SUMMARY OF THE INVENTION

According to embodiments of the invention, a method includes attaching a high voltage (HV) design level to an HV sector, an injector design level to an injector source, and a guard ring identifier to a guard ring, identifying the HV and a low voltage (LV) sector, and identifying injection sources and their device type (p vs. n, voltage capability). The method also includes evaluating a distance of the injection device from a target circuit, evaluating guard ring location, type, and characteristics, and evaluating an influence of the injection source on the target circuit. In accordance with embodiments, the invention further includes modifying device, circuit, and guard ring placement and spacing, and modifying circuit well and substrate contact spacing based on the distance from the injector.

According to further embodiments of the invention, a method includes identifying at least one high voltage device on a semiconductor chip, identifying a circuit on the semiconductor chip separated from the identified at least one high voltage device by a guard ring, evaluating the circuit for a latch-up condition, and when the latch-up condition occurs, adjusting the contact-circuit spacing in the circuit.

In accordance with still further embodiments, a semiconductor structure under design includes at least one high voltage sector and at least one low voltage sector, at least one injection device arranged within the at least one high voltage sector, at least one circuit located within the at least one low voltage sector; and a guard ring arranged between the at least one circuit and the injection device. Influence by the at least one injection device on the at least one circuit is adjustable via changeable contact-circuit spacing of the at least one circuit depending upon a distance between the injection device and the at least one circuit.

BRIEF DESCRIPTION OF DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

According to the invention, a design methodology of integrating high voltage circuit (HV) identifiers and virtual injector design levels can be utilized to identify the high voltage sector of a smart power chip. With this methodology, HV identifiers and "injector levels" can be used to identify the nature of the injection source.

The methodology of the invention can be utilized to modify the low voltage complementary metal oxide semiconductor (CMOS) well and substrate contact spacing as a function of distance from the high voltage injectors.

In this methodology, consideration of the HV level and injector level can distinguish between the high voltage lateral diffusion metal oxide semiconductor (LDMOS) injectors from the standard CMOS injection sources. In this manner, the invention can discriminate between the two types of circuits.

In general, semiconductor structures having mixed voltage levels are known. By way of example, such structures, e.g., in power technology, can include high voltage sectors, e.g., 25V/40V/120V, and low voltage sectors, e.g., 1.8V/5V, and the high voltage sector can include LDMOS transistors, e.g., using a "deep N-well." In these structures, latch-up can be inadvertently initiated through, e.g., inductive load dumps leading to an injection of substrate current into the chip substrate. As the high voltage sectors can initiate latch-up in the low voltage sector, the invention advantageously provides a method to design the semiconductor structures to isolate the low voltage sectors from the high voltage sectors.

According to the invention, at least one virtual level corresponding to, e.g., an HV level and/or an injector level can be utilized to identify high voltage LDMOS injector sources and/or to distinguish between high voltage LDMOS injector sources from standard CMOS injection sources. In this manner, one may utilize the inventive method to "flag" or otherwise discriminate between the two types of circuits.

Figure 1:
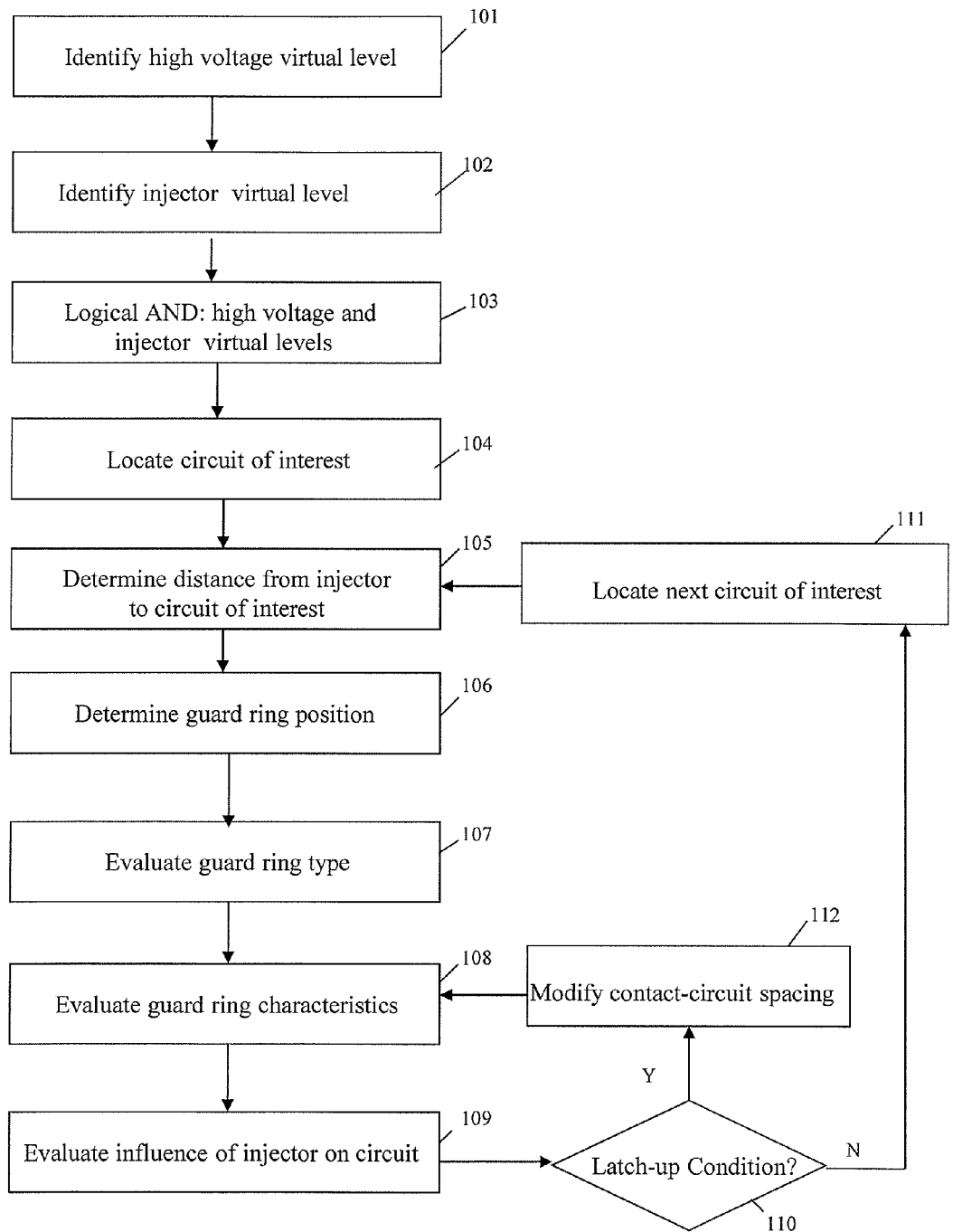
FIG. 1 illustrates an exemplary flow diagram of the invention.

An exemplary flow diagram of the methodology according to the invention is illustrated in FIG. 1. At step 101, high voltage sectors (or high voltage devices (HVdevs)) on the semiconductor structure can be identified. These sectors can be found by knowing the design of the chip. Further, a virtual shape or mask can be created or designed as a first virtual design level corresponding to the identified locations of the high voltage sectors on the known design. By way of non-limiting example, HVdevs can be placed on, e.g., a device, a built in p-cell, a circuit, a power grid (HV power), and/or a spatial sub-function (all HV region). Moreover, it is understood, if desired, that low voltage (LV) sectors can also be identified in a similar manner, e.g., with another virtual shape or mask created or designed to correspond to the locations of the LV sectors on the known design. At step 102, injectors (or injection devices), e.g., lateral diffusion metal oxide semiconductor (LDMOS) devices, can be identified. The injectors can be added to the semiconductor chip manually or through an automated procedure, and the type of injector can be identified by whether the device injects current into the substrate (an n-type diffusion metal oxide semiconductor (NDMOS)) or whether the device creates holes in the substrate (a p-type diffusion metal oxide semiconductor (PDMOS)). A second virtual design level corresponding to the locations of the identified injectors can also be created or designed.

The first and second virtual design levels can be logically ANDed together (or overlaid) at step 103 to locate the HVdev injectors in the semiconductor structure. Once these HVdev injectors are identified, it is advantageous to identify the circuits that these injectors may influence, e.g., by causing latch-up. One or more circuits of interest, e.g., low voltage CMOS logic circuits, can be located at step 104 based upon the spatial or schematic arrangement of HVdev injectors found in step 103. The locations of interest can be located, e.g., at the perimeter of the HV sector, adjacent to HVdevs, adjacent an HV guard ring, manually placed, such as inter-domain between sub-functions, and the locations of interest can also be identified as, e.g., the power grid and/or power domain.

Once the circuits of interest are located, a distance from an injector to a relevant, e.g., nearest, circuit of interest can be determined at step 105. Further, the injector and relevant circuit of interest can establish, e.g., a beginning and end point, and, at step 106, a determination is made whether a guard ring is arranged between the beginning and end point. If a guard ring is found, an evaluation of guard ring type, e.g., active or passive, can be made at step 107, and an evaluation of guard ring characteristics, e.g., width, depth, size, and/or shape, can be made at step 108. Once the guard ring type and characteristics are evaluated, the influence of the injection on the circuit is evaluated at step 109.

At step 110, an evaluation of the influence of the injector on the circuit of interest, e.g., the occurrence of latch-up, can be made. In this regard, latch-up can be determined, e.g., from design rules, from data tables, and/or from analytical relationship (such as circuit simulation, experimentation, analytical equations). If no latch-up is detected at step 110, the flow diagram locates the next circuit of interest at step 111, and then proceeds back to step 105 to determine the distance from the injector (or a different injector) to the next circuit of interest. If latch-up is detected at step 110, the circuit design can be changed to avoid the latch-up condition. According to the exemplary flow diagram, in response to a determination of latch-up in step 110, the substrate contact-circuit spacing can be modified at step 112. This changing of contact-circuit spacing, e.g., changing the spacing of an n-well contact relative to a pFET or changing the spacing of a p-well contact relative to an nFET, can make the circuits more robust. Further, the changed contact-circuit spacing can correspond to or be based on the distance between the injector and the circuit of interest determined at step 105.

In the case of high voltage injectors, it can be advantageous to establish distinct ground rules for spacing, and these ground rules can be checked, verified and modified, if necessary, based on the relative spacing between the injector source and the circuit of interest, e.g., low voltage CMOS logic circuits. These ground rules are in contrast to a situation in which the injector is a low voltage CMOS injection source, where the ground rules for contact spacing can be based simply on the low voltage injection sources themselves.

Figure 2:
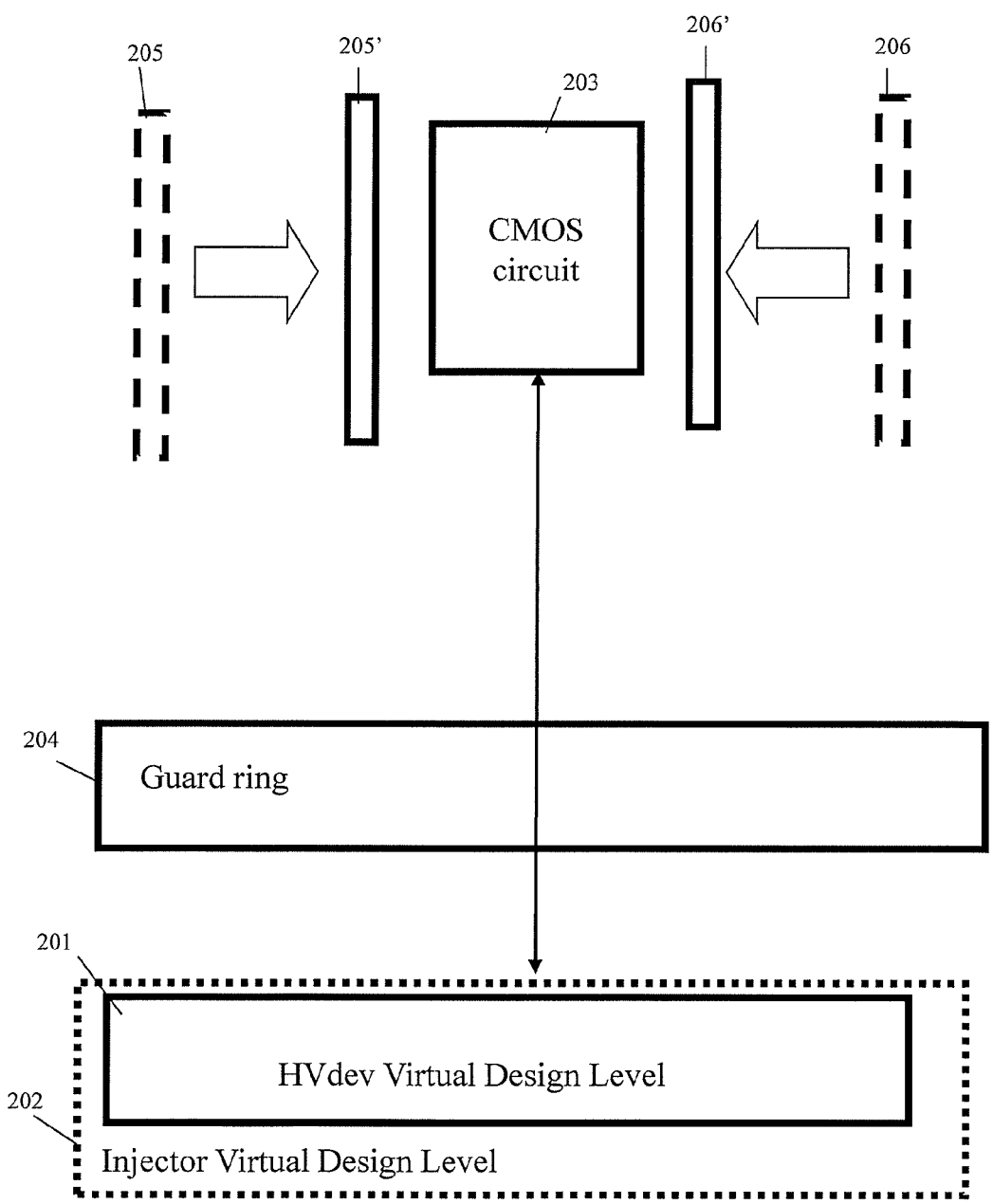
FIG. 2 schematically illustrates an exemplary semiconductor structure according to the invention.

FIG. 2 schematically illustrates an exemplary semiconductor structure with mixed voltage levels in accordance with the invention. As shown, an HVdev virtual level 201 and an injector virtual level 202 are created. These virtual levels are ANDed or overlaid to identify the HVdev injectors. CMOS circuit 203 is located as a circuit of interest, and the distance D corresponding to the spacing between the HVdev injector and circuit 203 is determined. A determination can then be made whether guard ring 204 is located between the HVdev injector and the circuit of interest, and, if so, the type and characteristics of guard ring 204 can be evaluated.

An evaluation of a latch-up occurrence can be made, and if latch-up occurs, a spacing of substrate contact 205 and well contact 206 can be incrementally changed relative to circuit 203, e.g., to locations 205' and 206', respectively, to obtain a more robust chip. Further, the changed contact-circuit spacing can correspond to or be based on the determined distance between the injector and the circuit of interest 203.

While the invention has been described in terms of exemplary embodiments, those skilled in the art will recognize that the invention can be practiced with modifications and in the spirit and scope of the appended claims.

What is claimed:

1. A method comprising:
   identifying at least one high voltage device on a semiconductor chip;
   identifying a circuit on the semiconductor chip separated from the identified at least one high voltage device by a guard ring;
   evaluating the circuit for a latch-up condition; and
   when the latch-up condition occurs, adjusting a contact-circuit spacing in the circuit using a computer.

2. The method in accordance with claim 1, wherein the identifying of at least one high voltage device comprises creating a virtual design level for high voltage sectors on the semiconductor chip.

3. The method in accordance with claim 1, wherein the identifying of at least one high voltage device comprises creating a virtual design level for injectors on the semiconductor chip.

4. The method in accordance with claim 1, wherein the identifying of at least one high voltage device comprises:
   creating a virtual design level for high voltage sectors on the semiconductor chip;
   creating a virtual design level for injectors on the semiconductor chip; and
   performing a logical AND of the virtual design level for high voltage sectors and the virtual design level for injectors.

5. The method in accordance with claim 1, further comprising determining a device type of the identified at least one high voltage device.

6. The method in accordance with claim 1, wherein the circuit is at least one of:
   arranged on a perimeter of a high voltage sector;
   arranged adjacent a high voltage device;
   arranged adjacent a high voltage ring;
   a power grid; and
   a power domain.

7. The method in accordance with claim 1, wherein the latch-up condition is evaluated by at least one of design rules, data tables, and analytical relationships.

8. The method in accordance with claim 1, further comprising determining a spacing between the identified at least one high voltage device and the circuit.

9. The method in accordance with claim 8, wherein the adjusted contact-circuit spacing is based on the determined spacing between the identified at least one high voltage device and the circuit.

10. The method in accordance with claim 1, further comprising determining a type and characteristics of the guard ring, wherein the characteristics comprise depth, width, size and shape of the guard ring.

11. The method in accordance with claim 10, further comprising adjusting at least one of the depth, the width, the size and the shape of the guard ring.

12. The method of claim 1, wherein:
   the semiconductor chip comprises at least one high voltage sector and at least one low voltage sector;
   the at least one high voltage device is on the high voltage sector;
   the identifying of the at least one high voltage device comprises:
      creating a virtual high voltage design level for the high voltage sector on the semiconductor chip;
      creating a virtual injector design level for injectors on the semiconductor chip; and
      overlaying the virtual design level for the high voltage sector and the virtual design level for the injectors; and
   the evaluating the circuit for the latch-up condition comprises determining that the latch-up condition occurs in the circuit based on a position of the guard ring.

13. A testing method for evaluating a semiconductor structure under design, comprising:
   identifying at least one injection device arranged within at least one high voltage sector;
   evaluating an influence of the at least one injection device on the at least one circuit; and
   in an event of a latch-up condition, adjusting a changeable contact-circuit spacing of the at least one circuit using a computer.

14. The testing method in accordance with claim 13, wherein the identifying of the at least one injection device comprises:
   creating a virtual design level for the at least one high voltage sector;
   creating a virtual design level for the at least one injection device; and
   performing a logical AND of the virtual design level for the at least one high voltage sector and the virtual design level for the at least one injection device.

15. The testing method in accordance with claim 13, wherein, in an event of a latch-up condition, the method further comprises adjusting guard ring characteristics to further adjust the influence of the at least one injection device on the at least one circuit.

* * * * *